United States Patent
Probst et al.

(10) Patent No.: US 11,217,689 B2
(45) Date of Patent: Jan. 4, 2022

(54) METHOD OF FORMING A SEMICONDUCTOR DEVICE AND STRUCTURE THEREFOR

(71) Applicant: SEMICONDUCTOR COMPONENTS INDUSTRIES, LLC, Phoenix, AZ (US)

(72) Inventors: Dean E. Probst, West Jordan, UT (US); Peter A. Burke, Portland, OR (US); Prasad Venkatraman, Gilbert, AZ (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 16/545,622

(22) Filed: Aug. 20, 2019

(65) Prior Publication Data
US 2020/0395478 A1  Dec. 17, 2020

Related U.S. Application Data

(60) Provisional application No. 62/862,368, filed on Jun. 17, 2019.

(51) Int. Cl.
*H01L 29/78* (2006.01)
*H01L 29/40* (2006.01)
*H01L 29/66* (2006.01)
*H01L 29/739* (2006.01)
*H01L 21/765* (2006.01)
*H01L 29/423* (2006.01)

(52) U.S. Cl.
CPC ........ *H01L 29/7811* (2013.01); *H01L 21/765* (2013.01); *H01L 29/404* (2013.01); *H01L 29/407* (2013.01); *H01L 29/4238* (2013.01); *H01L 29/42368* (2013.01); *H01L 29/66348* (2013.01); *H01L 29/66734* (2013.01); *H01L 29/7397* (2013.01); *H01L 29/7813* (2013.01)

(58) Field of Classification Search
CPC .......... H01L 29/7811; H01L 29/42368; H01L 29/4238; H01L 29/7813
See application file for complete search history.

(56) References Cited

U.S. PATENT DOCUMENTS 7,282,406 B2  10/2007  Grivna et al.
7,285,823 B2  10/2007  Loechelt et al.
(Continued)

OTHER PUBLICATIONS

Alan Huang, "Infineon OptiMOSTMPower MOSFET Datasheet Explanation," Infineon Technologies Austria AG Power Management and Multimarket, Application Note AN Mar. 2012, V1.1 Mar. 2012, 30 pages.

*Primary Examiner* — Shih Tsun A Chou
(74) *Attorney, Agent, or Firm* — Robert F. Hightower

(57) ABSTRACT

In one embodiment, a semiconductor device is formed having a plurality of active trenches formed within an active region of the semiconductor device. A first insulator is formed along at least a portion of sidewalls of each active trench. A perimeter termination trench is formed that surrounds the active region. The perimeter termination trench is formed having a first sidewall that is adjacent the active region and a second sidewall that is opposite the first sidewall. An insulator is formed along the second sidewall that has a thickness is greater than an insulator that is formed along the first sidewall.

19 Claims, 6 Drawing Sheets

(56) References Cited

U.S. PATENT DOCUMENTS

| | | | |
|---|---|---|---|
| 2005/0151190 A1* | 7/2005 | Kotek | H01L 29/7811 257/341 |
| 2010/0140689 A1* | 6/2010 | Yedinak | H01L 29/0611 257/330 |
| 2010/0140697 A1 | 6/2010 | Yedinak et al. | |
| 2011/0037120 A1 | 2/2011 | Chen et al. | |
| 2011/0039383 A1* | 2/2011 | Chen | H01L 29/407 438/270 |
| 2011/0220990 A1* | 9/2011 | Chang | H01L 29/7813 257/330 |
| 2013/0228857 A1 | 9/2013 | Lee et al. | |
| 2014/0353748 A1 | 12/2014 | Ma et al. | |
| 2016/0141376 A1 | 5/2016 | Rothmaler | |

\* cited by examiner

METHOD OF FORMING A SEMICONDUCTOR DEVICE AND STRUCTURE THEREFOR

PRIORITY CLAIM TO PRIOR PROVISIONAL FILING

This application claims priority to prior filed Provisional Application No. 62/862,368 entitled "METHOD OF FORMING A SEMICONDUCTOR DEVICE AND STRUCTURE THEREFOR" filed on Jun. 17, 2019, and having common inventors Probst et al. which is hereby incorporated herein by reference

BACKGROUND OF THE INVENTION

The present invention relates, in general, to electronics, and more particularly, to semiconductors, structures thereof, and methods of forming semiconductor devices.

In the past, the semiconductor industry utilized various methods and structures to form semiconductor devices that had an active region which provided a mechanism for current flow through the semiconductor device, and a non-active region which was not intended to conduct current. In some applications, the non-active regions had a larger area. These larger non-active regions increased parasitic capacitance to some of the structures of the active region thereby affecting the performance of the semiconductor device.

Accordingly, it is desirable to have a semiconductor device that that has a smaller size, that has reduced parasitic capacitance, and/or that has improved performance.

Figure 1:
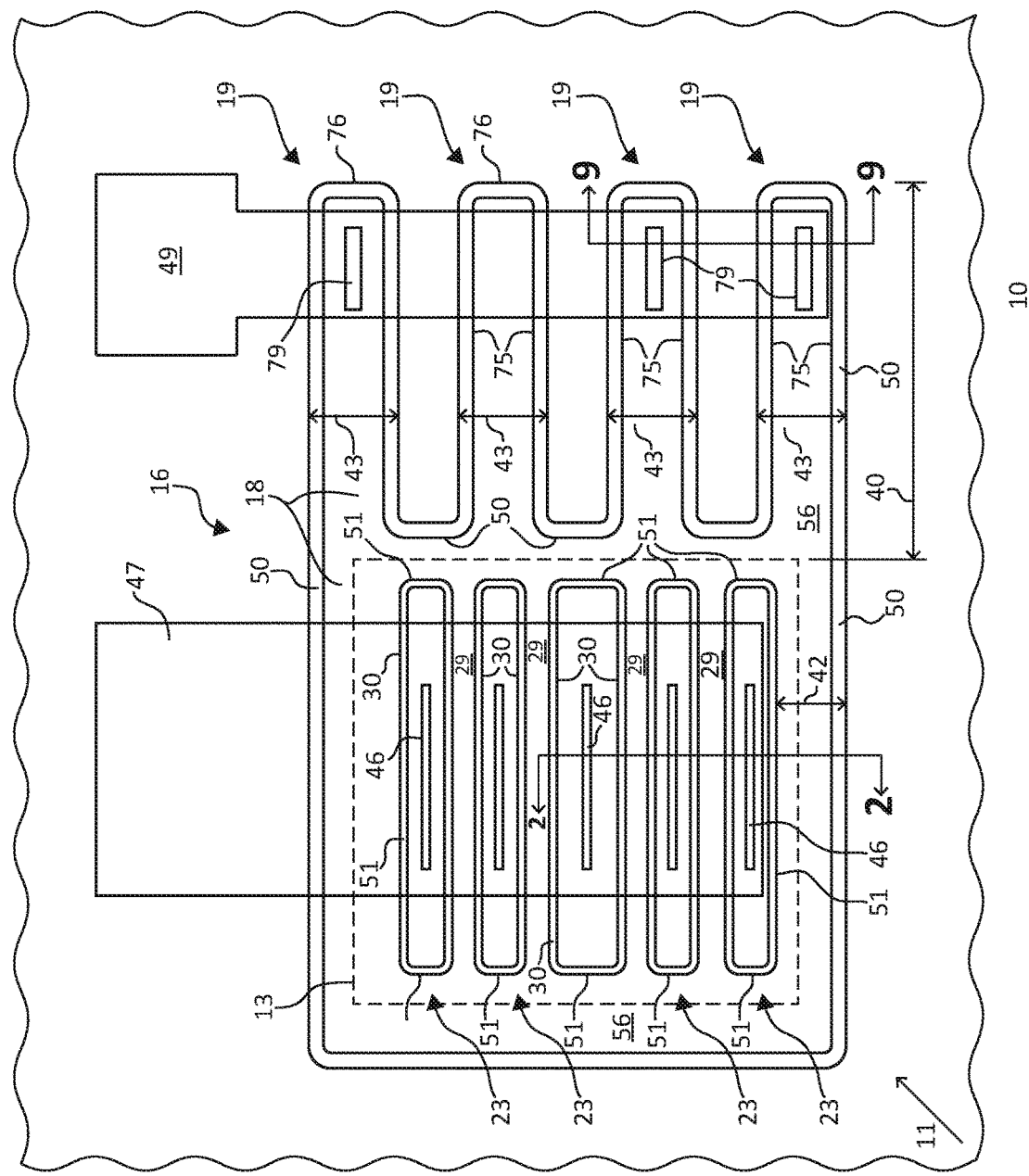
FIG. 1 illustrates an enlarged plan view of an example of a portion of an embodiment of a semiconductor device in accordance with the present invention.

For simplicity and clarity of the illustration(s), elements in the figures are not necessarily to scale, some of the elements may be exaggerated for illustrative purposes, and the same reference numbers in different figures denote the same elements, unless stated otherwise. Additionally, descriptions and details of well-known steps and elements may be omitted for simplicity of the description. As used herein current carrying element or current carrying electrode means an element of a device that carries current through the device such as a source or a drain of an MOS transistor or an emitter or a collector of a bipolar transistor or a cathode or anode of a diode, and a control element or control electrode means an element of the device that controls current through the device such as a gate of an MOS transistor or a base of a bipolar transistor. Additionally, one current carrying element may carry current in one direction through a device, such as carry current entering the device, and a second current carrying element may carry current in an opposite direction through the device, such as carry current leaving the device. Although the devices may be explained herein as certain N-channel or P-channel devices, or certain N-type or P-type doped regions, a person of ordinary skill in the art will appreciate that complementary devices are also possible in accordance with the present invention. One of ordinary skill in the art understands that the conductivity type refers to the mechanism through which conduction occurs such as through conduction of holes or electrons, therefore, that conductivity type does not refer to the doping concentration but the doping type, such as P-type or N-type. It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for some elements including semiconductor doping concentrations) are reasonable variances from the ideal goal of exactly as described. When used in reference to a state of a signal, the term "asserted" means an active state of the signal and the term "negated" means an inactive state of the signal. The actual voltage value or logic state (such as a "1" or a "0") of the signal depends on whether positive or negative logic is used. Thus, asserted can be either a high voltage or a high logic or a low voltage or low logic depending on whether positive or negative logic is used and negated may be either a low voltage or low state or a high voltage or high logic depending on whether positive or negative logic is used. Herein, a positive logic convention is used, but those skilled in the art understand that a negative logic convention could also be used. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. Furthermore, the particular features, structures or characteristics may be combined in any suitable manner, as would be apparent to one of ordinary skill in the art, in one or more embodiments. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

In addition, the description illustrates a cellular design (where the body regions are a plurality of cellular regions) instead of a single body design (where the body region is comprised of a single region formed in an elongated pattern, for example in a serpentine pattern in some embodiments). However, it is intended that the description is applicable to both a cellular implementation and a single base implementation.

The embodiments illustrated and described hereinafter suitably may have embodiments and/or may be practiced in the absence of any element which is not specifically disclosed herein.

DETAILED DESCRIPTION OF THE DRAWINGS

FIG. 1 illustrates an enlarged plan view of an example of a portion of an embodiment of a semiconductor device 10 that has a smaller surface area and reduced cost. Device 10 includes an active region 13 (illustrated in a general manner by a dashed box) that has active elements formed therein. The active elements function to form current flow through the active elements. For example, region 13 may include active elements such as source and gate elements of a transistor that function to form current flow between a source and drain of the transistor, or may include anode and/or cathode regions of a diode that form current flow therebetween, or other active elements that function to create a current flow through active region 13. In an example embodiment, device 10 includes a field effect transistor (FET) 11 that has active elements formed within active region 13. A plurality of active trenches 23 having active elements (see also FIG. 2) are formed within region 13. Device 10 also includes a termination region 14 (See FIG. 2) that is external to region 13. Device 10 may also include other elements that are not illustrated in FIG. 1.

A termination structure 16, illustrated in general by an arrow, is formed surrounding active region 13. Structure 16 includes a perimeter termination trench 18 that surrounds all of active region 13. In an embodiment, perimeter termination trench 18 completely surrounds active region 13.

Figure 2:
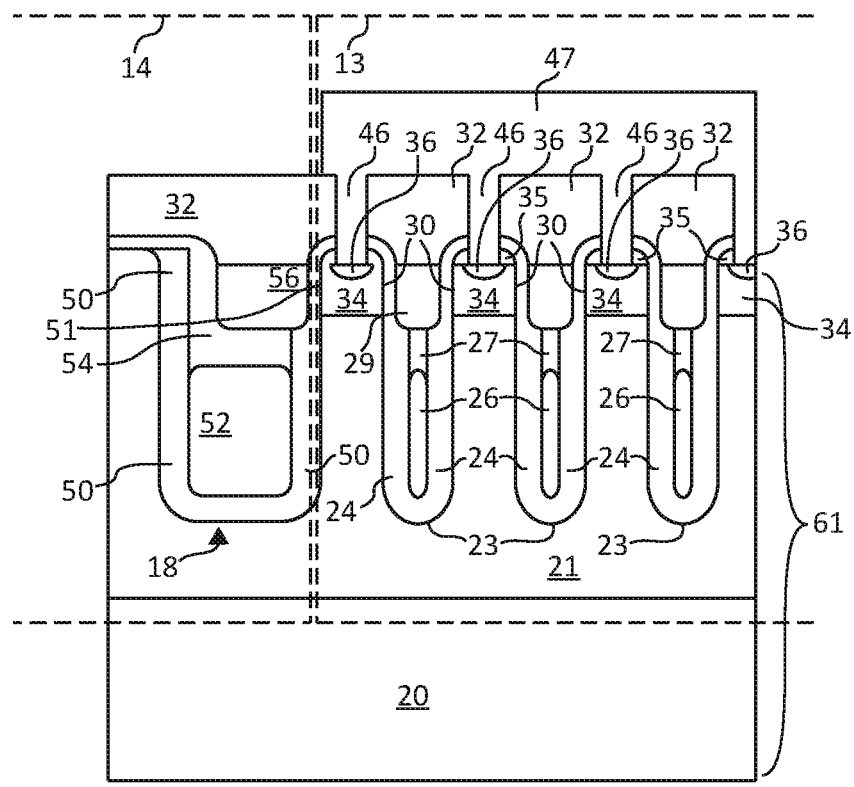
FIG. 2 illustrates an enlarged cross-sectional portion of the device of FIG. 1 in accordance with the present invention.

FIG. 2 illustrates an enlarged cross-sectional portion of device 10 formed along cross-sectional line 2-2 of FIG. 1. Device 10 includes a semiconductor substrate 61. An embodiment of substrate 61 may include a semiconductor substrate 20 that has a doped region 21 formed on a surface of substrate 20. Substrate 20 may include multiple layers instead of the single layer illustrated in FIG. 2. For instance, substrate 20 may include a bulk silicon substrate and other layers formed on the bulk silicon substrate, such as for example epitaxial layers. Doped region 21 may be a layer formed on substrate 20, such as for example an epitaxial layer, or may be a doped region of a portion of substrate 20.

Device 10 includes active region 13 and termination region 14. Active trenches 23 are formed in substrate 61 within active region 13 (both illustrated in a general manner by dashed lines). Perimeter termination trench 18 is formed at least partially within termination region 14. A gate conductor 29 is formed within active trenches 23. As will be seen further hereinafter, a portion of the material used to form gate conductors 29 extends laterally from within active trenches 23 and extends into trench 18 and forms a gate conductor 56 within trench 18. Thus, conductor 56 is electrically connected directly to conductors 29.

Referring to FIGS. 1 and 2, trench 18 has an inner sidewall that is nearest to active region 13, and an outer sidewall that is spaced apart from active region 13 by at least the width of trench 18. An insulator 51 is formed along the inner sidewall of trench 18 that is adjacent to active region 13. An insulator 50 is formed along the outer sidewall of trench 18 that is spaced away from active region 13. Insulator 50 has a thickness that is greater than the thickness of insulator 51. In an embodiment, the inner sidewall of trench 18 and insulator 51 may be within active region 13.

Near one side of active region 13, the outer sidewall of trench 18 extends to form gate contact trenches 19 that extend in a direction away from that side of active region 13. An embodiment may include that gate contact trenches 19 extend in a direction that is parallel to a direction that gate conductor 29 extends within active region 13 or alternately within trenches 23. An embodiment of trenches 19 may extend in a direction that is substantially parallel to a long direction of conductor 29 within trenches 23. In an embodiment, each trench 19 may have a shape of a finger-like projection or a "U" shaped projection that has an open end of the shape adjacent to the side of active region 13, and a closed end of the shape spaced a distance 40 (illustrated by an arrow) away from the side of active region 13. For example, trenches 19 may be formed at an end of device 20 such that there is not another active region 13 positioned past the end of trench 18, as is illustrated in FIG. 1. An embodiment may include that distance 40 is no less than approximately three microns.

Figure 10:
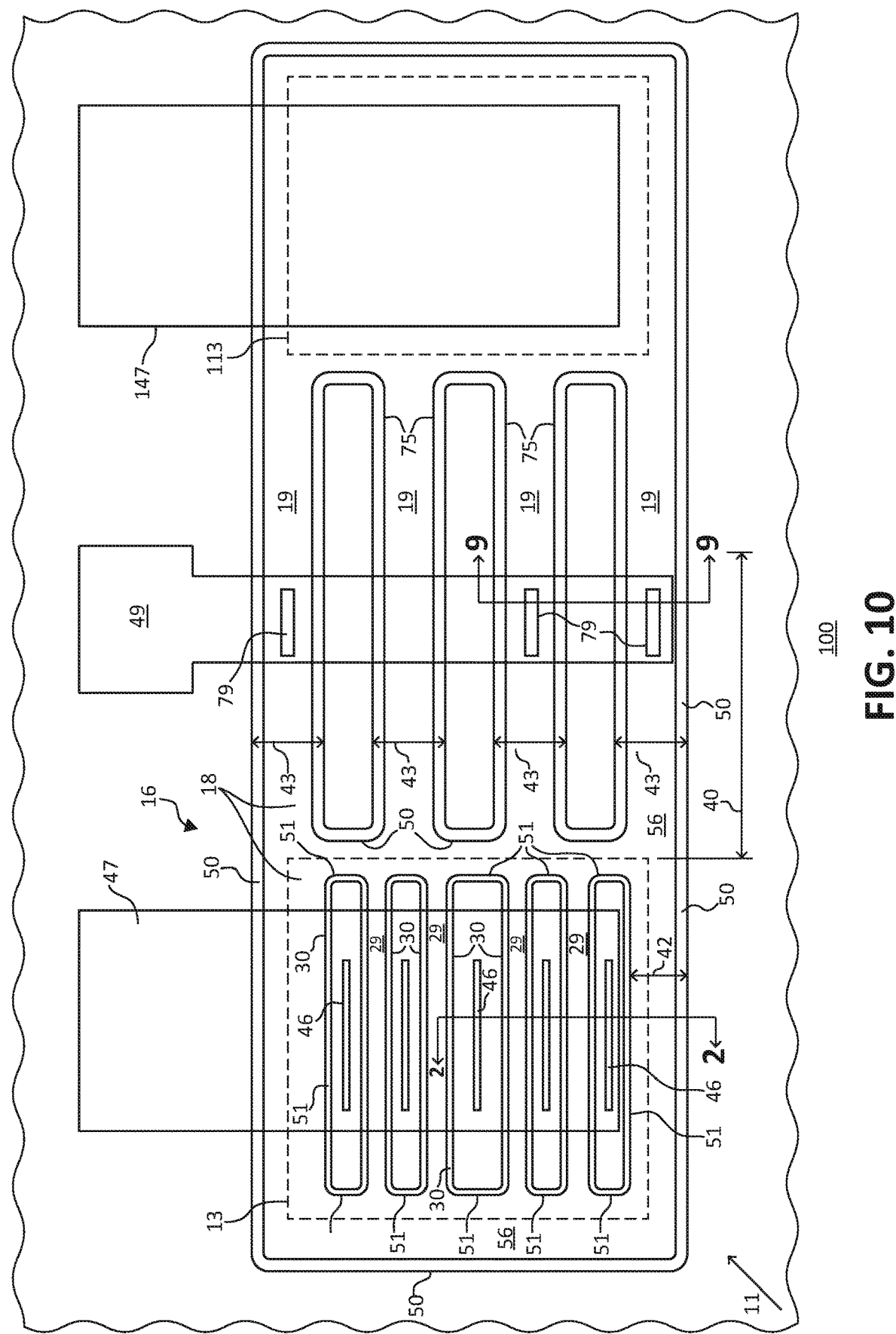
FIG. 10 illustrates an enlarged plan view of an example of a portion of an embodiment of a semiconductor device that may have an embodiment that may be an alternate embodiment of the device of FIG. 1 in accordance with the present invention.

FIG. 10 illustrates an enlarged plan view of an example of a portion of an embodiment of a semiconductor device 100 that may have an embodiment that may be an alternate embodiment of device 10. Device 100 is substantially the same as device 10 except that device 100 includes another active region 113 that is disposed or positioned on an opposite end of trenches 19 from region 13. Device 100 may include a source interconnect conductor 147 that is another version of conductor 47 but positioned within region 113 instead of within region 13. Trenches 19 of device 100 extend substantially parallel to the long axis of conductor 29 within trenches 23 of both region 13 and region 113. Thus, trenches 19 do not have the "U" shaped closed end that is illustrated in FIG. 1.

As will be seen further hereinafter, gate contact trenches 19 assist in forming an electrical connection to gate conductor 29 that is within active trenches 23 of region 13. A gate contact via 79 is formed near an end of one or more of trenches 19 (see also FIG. 9). Trenches 19 that do not have vias 79 may have a width that is narrower than the width of the remainder of trench 18. As will be seen further hereinafter, gate interconnect conductor 49 is formed to extend across perimeter termination trench 18 and contact a portion of gate conductor 56 that underlies each via 79. Those skilled in the art will appreciate that conductor 49 does not extend into or extend to overlie active region 13 and does not overlie any of active trenches 23.

Figure 3:
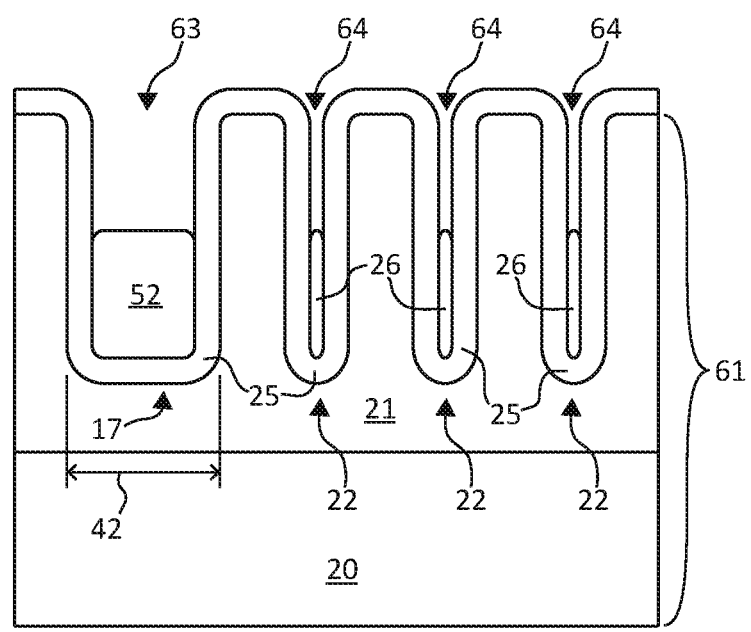
FIG. 3 illustrates an enlarged cross-sectional portion of the device of FIGS. 1 and 2 at an early stage in an example of an embodiment of a method of forming the device in accordance with the present invention.

FIG. 3 illustrates an enlarged cross-sectional portion of device 10 that is illustrated in FIG. 2 at an early stage in an example of an embodiment of a method of forming device 10. Doped region 21 is formed on the surface of substrate 20 such as by doping a portion of substrate 20 or by forming an epitaxial layer or other type of doped layer on substrate 20. Openings 22 are formed within region 13 where active trenches 23 are to be formed, and an opening 17 is formed in termination region 14 where perimeter termination trench 18 is to be formed. Openings 17 and 22 extend from the surface of substrate 61 a distance into substrate 61. An embodiment may include that openings 17 and 22 are formed at the same time and extend substantially the same distance into substrate 61. In other embodiments, openings 17 and 22 may be formed at different times and may extend to different depths. An embodiment may include that opening 17 has a larger width than openings 22. For example, opening 17 may be at least approximately one and a half (1.5) times the width of openings 22. In other embodiments, opening 17 may be approximately four times the width or alternately may be approximately ten (10) times the width or alternately any width between approximately five and approximately ten (5-10) times the width.

Subsequently, an insulator 25 is formed along the sidewalls (including the bottoms) of openings 17 and 22. The width of insulator 25 fills a portion of openings 17 and 22, and leaves the remainder of opening 17 with an opening 63, and leaves the remainder of openings 22 with openings 64. An embodiment may include that insulator 25 extends out of openings 17 and 22 and extends across the surface of substrate 61. Insulator 25 may be any well-known insulator material used in manufacturing semiconductors, such as for example silicon dioxide, silicon nitride, silicon oxy-nitride, or other well-known insulators. In an embodiment, insulator 25 may be silicon dioxide that is formed by oxidizing at least the sidewalls and bottoms of openings 17 and 22. The material of insulator 25 may alternately be formed by deposition or a combination of deposition and growth.

Subsequently, a conductor may be formed within openings 63 and 64 to partially fill opening 63 and 64. The conductor forms a shield conductor 52 within opening 17 and a shield conductor 26 within openings 22. The material used to form conductors 26 and 52 may be any well-known conductor material such as doped polysilicon, or silicided polysilicon, or a metal, or a combination of any of these. Methods of forming such conductor materials are well-known to those skilled in the art.

Figure 4:
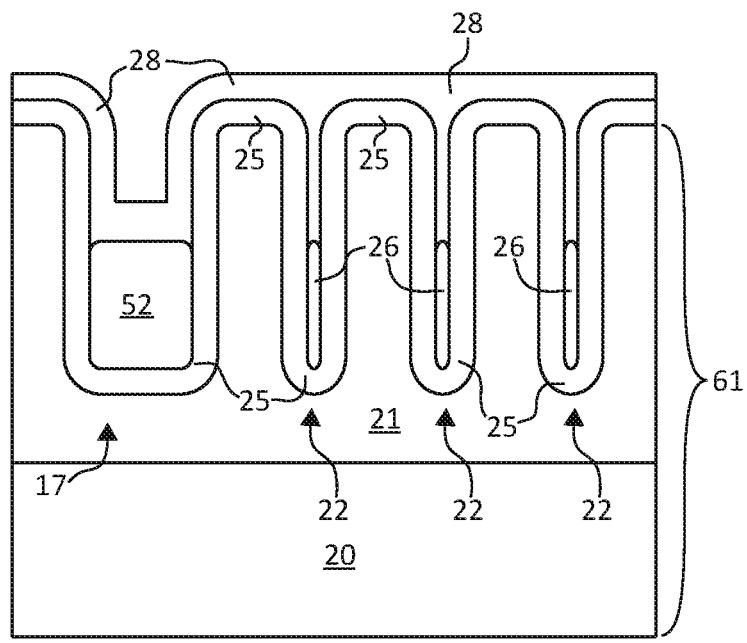
FIG. 4 illustrates a subsequent stage in an example of an embodiment of a method of forming the device of FIGS. 1-2 in accordance with the present invention.

FIG. 4 illustrates a subsequent stage in an example of an embodiment of a method of forming device 10. An insulator 28 is formed within openings 17 and 22 to cover conductors 26 and 52, and is also formed along the sidewalls of openings 17 and 22. An embodiment may include that insulator 28 extends out of openings 17 and 22 and extends onto insulator 25 across the surface of substrate 61. In an embodiment, insulator 28 may completely fill openings 22 but not necessarily opening 17. Insulator 28 may be any one of a variety of well-known insulators used in semiconductor manufacturing. Insulator 28 may be any of the same types of insulators listed for insulator 25 in addition to borosilicate glass (BSG). Insulator 28 may be formed by chemical vapor deposition, evaporation, or other well-known techniques.

Figure 5:
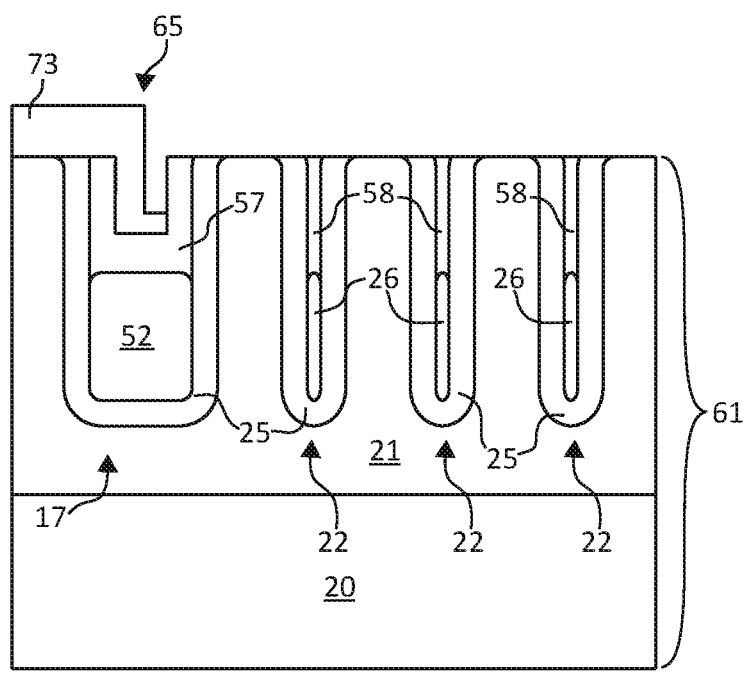
FIG. 5 illustrates another subsequent stage in an example of an embodiment of a method of forming the device of FIGS. 1-2 in accordance with the present invention.

FIG. 5 illustrates another subsequent stage in an example of an embodiment of a method of forming device 10. Insulators 28 and 25 are substantially removed from the surface of substrate 61. A variety of different techniques may be utilized to remove insulators 28 and 25. For example chemical-mechanical polishing (CMP) can be used or an etching technique such as for example a blanket etch process may also be used. The removal of insulators 25 and 28 leaves an insulator 58 filling openings 22.

Regarding opening 17, the removal of insulators 25 and 28 leaves a portion of insulator 28 within opening 17 as an insulator 57. Insulator 57 is formed on conductor 52 and on the sidewalls of opening 17, and leaves an opening 65 as the remainder of opening 17 overlying a portion of conductor 52.

Thereafter, a mask 73 may be formed overlying a portion of insulators 25 and 57 that are on the outer sidewalls of trench 18 in termination region 14, and also formed along a bottom of opening 65. Mask 73 exposes at least a portion of insulator 57 that is along the inner sidewall of opening 17. Mask 73 may have an embodiment that also abuts the portion of insulator 57 that is on the inner sidewall of opening 17 that faces toward openings 22.

Figure 6:
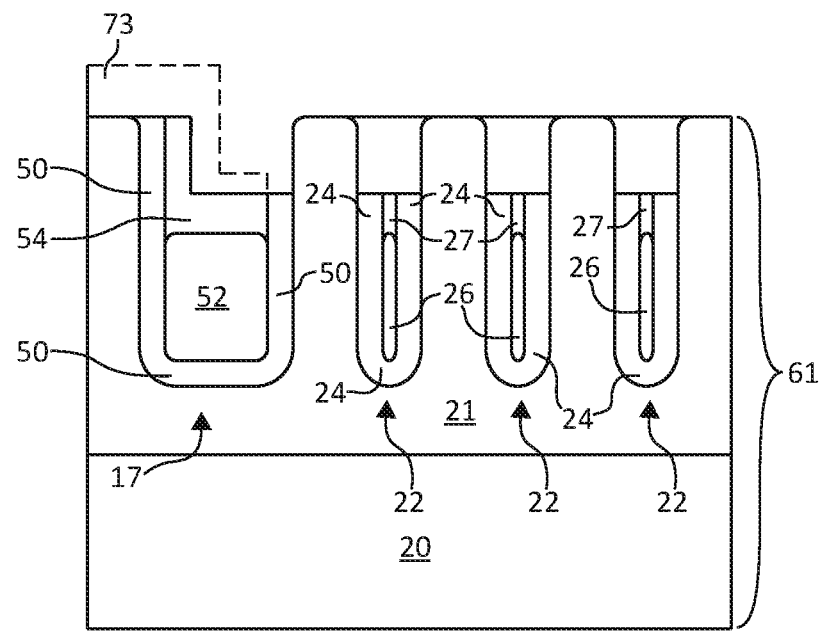
FIG. 6 illustrates yet another subsequent stage in an example of an embodiment of a method of forming the device of FIGS. 1-2 in accordance with the present invention.

FIG. 6 illustrates yet another subsequent stage in an example of an embodiment of a method of forming device 10. In openings 22, a portion of insulator 58 (FIG. 5) overlying conductors 26 is removed along with a portion of insulator 25 (FIG. 5) along the sidewalls of openings 22 that is above conductors 26. The removal process leaves a portion of insulator 58 overlying conductor 26 as an insulator 27 overlying conductor 26, and leaves least a portion of insulator 25 along the sidewalls of openings 22 as an insulator 24. Insulator 24 is along the sidewalls of opening 22 that are adjacent to conductor 26 and adjacent to insulator 27 that overlies conductor 26.

Figure 8:
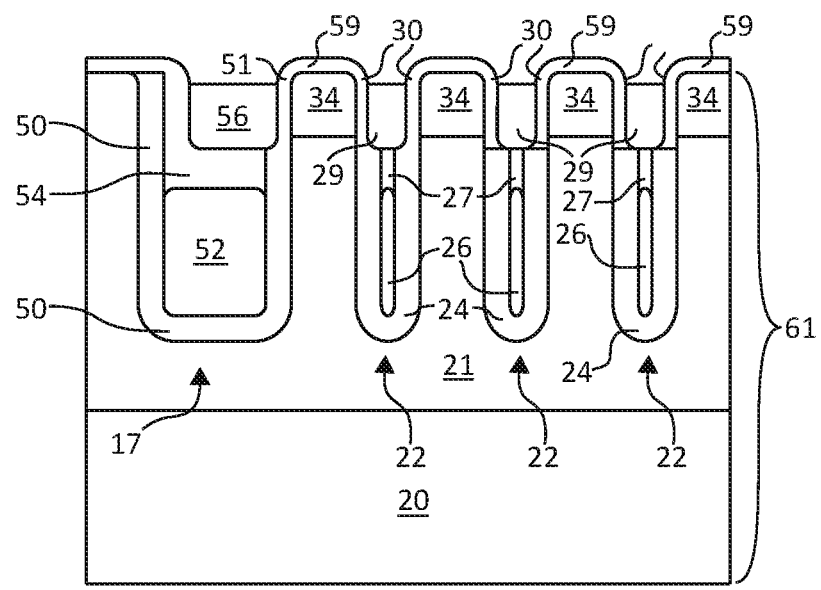
FIG. 8 illustrates another subsequent stage in an example of an embodiment of a method of forming the device of FIGS. 1-2 in accordance with the present invention.

Regarding opening 17, the removal process also removes a portion of insulators 25 and 57 (FIG. 5) that are along the inner sidewall of opening 17 that is adjacent to openings 22. The removal leaves a portion of insulator 57 as an insulator 54 overlying conductor 52 and along the outer sidewall of opening 17 that is distal or away from openings 22, or alternately a sidewall that is opposing the inner sidewall that is closest to opening 22. The removal also removes a portion of insulator 25 that is along the inner sidewall of opening 17, this forms the remaining portion of insulator 25 into an insulator 50 on the outside sidewall and bottom of opening 17, and along a lower portion of the inside sidewall of opening 17. Insulator 50 along the lower portion of the inner sidewall of opening 17 is adjacent to conductor 52 and adjacent to insulator 54 that overlies conductor 52. Those skilled in the art will appreciate that insulators 50 and 54 do not extend up to be adjacent to region 34 (FIGS. 2 and 8).

Those skilled in the art will appreciate that in some embodiments insulators 25, 57, and/or 58 may not all be removed at the same rate. Thus, the surfaces formed by insulators 24, 27, 50, and 54 may not be flat as is illustrated in FIG. 6. Such irregularities in the surfaces is not illustrated for simplicity of the drawings.

Subsequently, mask 73 may be removed as illustrated by the dashed lines in FIG. 6.

Figure 7:
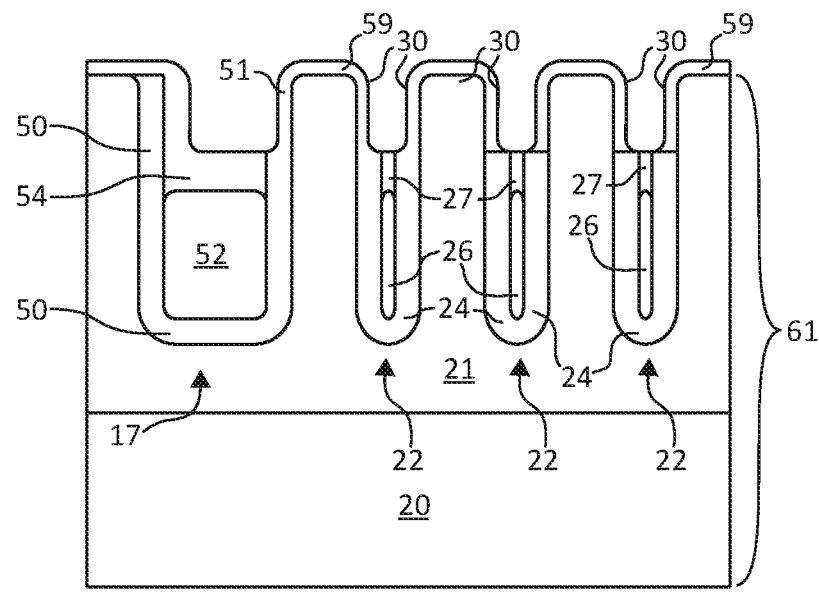
FIG. 7 illustrates another subsequent stage in an example of an embodiment of a method of forming the device of FIGS. 1 and 2 in accordance with the present invention.

FIG. 7 illustrates another subsequent stage in an example of an embodiment of a method of forming device 10. An insulator 59 is formed along the exposed sidewalls of openings 22 and along the exposed inner sidewall of opening 17. An embodiment of insulator 59 may extend across the surface of substrate 61 and extend into openings 17 and 22 to abut respective insulators 50 and 24. The portion of insulator 59 within opening 17 forms an insulator 51 along the inner sidewall of opening 17. In some embodiments, forming insulator 51 may increase the sidewall thickness and top thickness of insulator 54. The portion of insulator 59 within openings 22 forms an insulator 30 along the upper sidewalls of openings 22. Insulators 30, 51, and 59 may be formed by variety of techniques including deposition, chemical vapor deposition, or oxidation, or a combination of any of these. In an embodiment, insulators 30, 51, and 59 may be silicon dioxide that is formed by oxidizing the exposed surface of substrate 61 and the exposed sidewalls of openings 17 and 22. The thickness of insulators 30, 51, and 59 is much less than the thickness of insulator 24 and insulator 50. Insulators 30, 51, and 59 may have an embodiment wherein the thickness is between approximately ten nano-meters (10 nm) to approximately one hundred and fifty nano-meters (150 nm). In an embodiment, insulators 24 and 50 may be one and one half (1.5) to approximately fifty (50) times the thickness of insulators 30, 51, and 59.

The thickness of insulator 59 leaves an opening above insulator 27 within opening 22, and the thickness of insulator 51 leaves an opening above insulator 54 within opening 17.

FIG. 8 illustrates another subsequent stage in an example of an embodiment of a method of forming device 10. A conductor material is formed within at least a portion of the remainder of openings 17 and 22 to form a gate conductor 29 within openings 22 and to form a gate conductor 56 within opening 17. Insulator 27 forms a separator insulator that separates conductor 26 from conductor 29, and insulator 54 forms a separator insulator that separates conductor 52 from conductor 56. In openings 22, conductor 29 abuts at least insulator 30. In opening 17, conductor 56 abuts at least insulator 51 along the inner sidewall. In an embodiment, conductors 29 and 56 do not extend above the surface of substrate 61. The material used for conductors 29 and 56 can be any well-known gate conductor material, such as doped polysilicon, silicided polysilicon, refractory metal silicide, metal, or other well-known gate conductor materials, or a combination of any of these. The portion of insulator 30 abutting conductor 29 forms a gate insulator of transistor 11, and the portion of insulator 51 abutting conductor 56 forms another gate insulator of transistor 11.

Subsequently, a doped region 34 may be formed in active region 13. In an embodiment, region 34 may function as the body region of transistor 11. Region 34 may be formed on the surface of and within region 21 adjacent to and extending to abut each insulator 30 of openings 22, and also to abut insulator 51 of opening 17. Region 34 is formed external to openings 17 and 22. An embodiment of doped region 34 may have a conductivity type that is the opposite to the conductivity type of region 21. For example, region 21 may have an N-type conductivity and region 34 may have a P-type conductivity. An embodiment may include that region 34 extends outside of active region 13 past trench 18, but not within trench 18.

Alternately, region 34 may be formed prior to forming openings 17 and 22 (FIG. 2), and openings 17 and 22 may be formed to extend through region 34.

Referring back to FIG. 2, a doped region 35 may be formed within region 34 to function as the source region of transistor 11. A portion of region 35 may be disposed between insulators 30 external to each trench 23 and abut those insulators 30. In some embodiments, a portion of region 34 may underlie region 35, and may also abut insulators 30 and 51. In an embodiment, region 35 has a conductivity type that is opposite to the conductivity type of region 34. Device 10 has an embodiment that is devoid of a region 35 adjacent to or abutting insulator 51.

An insulator 32 may be formed on the surface of substrate 61 and overlying trenches 18 and 23. Openings 46 may be formed in insulator 32 overlying portions of regions 35 to allow access to regions 35. The opening may be extended through region 35 to expose region 34. Thereafter, doped region 36 may be formed in region 34 to allow forming a low resistance electrical contact to region 34. Thereafter, a conductor material may be formed on insulator 32 and through openings 46 to form a source interconnect conductor 47 that is electrically and physically connected to regions 34 and 35.

Figure 9:
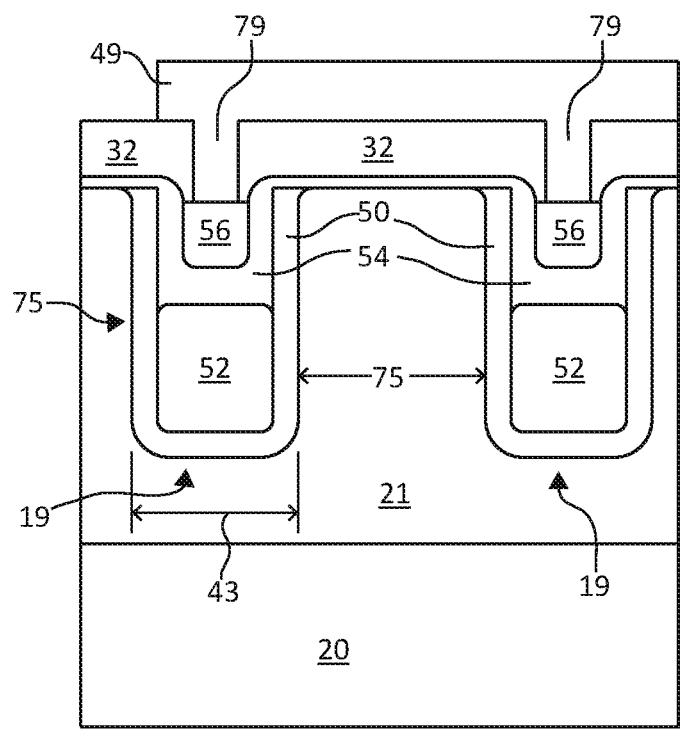
FIG. 9 illustrates another enlarged cross-sectional portion of the device of FIG. 1 in accordance with the present invention.

FIG. 9 illustrates an enlarged cross-sectional portion of device 10 along cross-sectional line 9-9 of FIG. 1. A portion of the outside sidewall of trench 18 extends past active region 13 (FIG. 1) to form gate contact trenches 19. Trenches 19 have opposing sides 75 that extend in a direction away from an end of one or more of active trenches 23. An embodiment of trenches 19 may have a connecting portion 76 (FIG. 1) that interconnects sides 75. In other embodiments of trenches 19 (FIG. 10), sides 75 may extend in a direction away from trenches 23 of active region 13 and away from trenches 23 of active region 113. Sides 75 are formed in a manner that is the same as the outside sidewalls of trench 18. For example, opening 17 (FIG. 3) may be formed to extend laterally past active region 13 to form the opening for trenches 19. Insulator 25 (FIG. 3) may be formed within the portion of opening 17 that forms trenches 19. Insulator 25 (FIG. 3) may be formed along the sidewalls and ends of trenches 19. Conductor 52 is formed within trenches 19 and abuts insulator 25. Insulator 28 (FIG. 4) may be formed in the portion of opening 17 that forms trenches 19. The portion of insulators 25 and 28 on the surface of substrate 61 is removed leaving insulators 50 and 54 within trenches 19. Mask 73 (FIG. 5/6) may cover all of trenches 19 so that insulators 50 and 54 are not removed from the sidewalls thereof. In trenches 19, insulator 59 (FIG. 7) may be formed on insulator 54 and may increase the thickness thereof. Gate conductor 56 may be formed in trenches 19 and abutting insulator 54. A width 43 of trenches 19 is greater than the width of trenches 23. In an embodiment, width 43 of trenches 19 may be the same as a width 42 of trench 18 adjacent to active region 13.

Insulator 32 is formed overlying trenches 19 and the space between trenches 19. Openings are formed in insulator 32 near the ends of trenches 19 to form gate contact vias 79 that allow access to conductor 56 within trenches 19. In the embodiment of device 10 illustrated in FIG. 1, the opening in insulator 32 may be formed near the end of trenches 19, and in the embodiment of device 100 illustrated in FIG. 10, the openings in insulator 32 may be formed near the center of trenches 19. Gate contact via 79 is formed near an end of one or more of trenches 19 that is spaced away from active region 13. Gate interconnect conductor 49 extends across perimeter termination trench 18 and contacts the portion of gate conductor 56 that underlies each via 79.

Referring to FIGS. 1 and 9, gate conductor 56 fills a space within perimeter termination trench 18 that is between insulators 50 and 51 adjacent to active trenches 23, and also fills the space between sides 75 of trenches 19. Gate conductor 56 also fills all of trench 18 between insulators 50 and 51 (FIGS. 2 and 8). The inner sidewall of trench 18, that has insulator 51 thereon, extends along the sides of active region 13, thus along the ends of trenches 23 that is adjacent to a side of region 13. The portion of trenches 23 that are interior to region 13 have insulator 30 along the sidewalls thereof (FIGS. 1-2). For example, the portion of trenches 23 that are adjacent to another trench 23, has insulator 30 along the sidewalls that are adjacent to another trench 23. But insulator 51 extends along the ends of trenches 23 that are not adjacent to another trench 23. Thus, conductor 29 that is within trenches 23 extends to abut conductor 56 and form a continuous conductor that is connected through vias 79 to conductor 49. Those skilled in the art will appreciate that the conductor portion that is via 79 may be a different conductor material than the material used for conductor 49. For example, the conductor material within via 79 may be a tungsten (W) plug and the material of conductor 49 may be a different metal or a combination of metal layers.

Referring to FIGS. 1 and 2, during operation conductors 29, that are adjacent to a region 35, form a channel region within region 34 that allows current flow between regions 35 and 21 and through region 34. In an embodiment, conductor 56 does not form a channel region.

Also, during operation when a reverse bias is applied, the thickness of insulator 50 provides the charge-balance that is required to provide an improved breakdown voltage. In an embodiment, the combined thickness of insulators 50 and 54 in trenches 19 is sufficient to withstand the breakdown voltage of device 10 or 100. Hence, the regions between trenches 19 can be at drain potential, without degrading the reliability of the device. Thus, body regions 34 may be omitted from the space between trenches 19, or if they are present, they may be left floating, without electrical contact to the source metallization. Consequently, the width of the portions of region 21 that is between trenches 19 need not be the same as between the width active trenches 23, since there is no charge balance requirement in these regions. In some embodiments, the portion of region 21 that extends to the surface of substrate 61 and is disposed between trenches 23 and between trenches 19 may be referred to as a "mesa" or "silicon mesa".

From all the foregoing, one skilled in the art will appreciate that an example of an embodiment of a semiconductor device having a transistor may comprise:
the transistor, such as for example transistor 11, having an active region, such as for example region 13, that has a plurality of active trenches, such as for example trenches 23;
a gate conductor, such as for example conductor 29, within each active trench of the plurality of active trenches;
a first insulator, such as for example insulator 30, of a first thickness along sidewalls of each active trench wherein the gate conductor is positioned between the first insulator that is on opposite sidewalls of each trench;
a perimeter termination trench, such as for example trench 18, surrounding the active region, the perimeter termination trench having a second insulator, such as for example insulator 51, of a second thickness along an inner sidewall that is adjacent to the active region and having a third insulator, such as for example insulator 50, of a third thickness along an outer sidewall that is opposite to the inner sidewall, wherein the third thickness is greater than the second thickness;
the gate conductor extending from each active trench to within the perimeter termination trench to form a gate connection conductor, such as for example conductor 56, and positioned between and contacting the second insulator and the third insulator;
one or more gate contact trenches, such as for example trenches 19, of the perimeter termination trench, wherein each of the one or more gate contact trenches has opposing sides, such as for example sides 75, that project and extend in a direction that is away from an end of one or more of the plurality of active trenches, the third insulator along each sidewall of the one or more gate contact trenches and the gate conductor extending within each gate contact trench and positioned between the third insulator along opposing sidewalls, such as for example sidewall 75, of each gate contact trench.

An embodiment may also include that the second thickness may be substantially the first thickness.

Another embodiment may also include a gate interconnect conductor, such as for example conductor 49, overlying at least a portion of the gate contact trench, such as for example trench 19.

The semiconductor device may have an embodiment that may include a source region, such as for example region 35, positioned between adjacent active trenches.

An embodiment may also include a gate interconnect conductor, such as for example conductor 49, overlying the one or more gate contact trenches, such as for example trenches 19, and extending into the one or more gate contact trenches to electrically connect to the gate conductor therein.

The gate interconnect conductor may have an embodiment wherein the gate interconnect conductor does not overlie the gate conductor within an active trench of the plurality of active trenches.

In an embodiment, the gate conductor may have a width that is greater than a width of the gate conductor within an active trench.

In an embodiment, each gate contact trench may have a connecting portion, such as for example portion 76, that connects together the opposing sides, wherein the third insulator may be along each sidewall of the connecting portion of the one or more gate contact trenches.

An embodiment may also include a shield conductor within each active trench and underlying each gate conductor therein, and also underlying each gate conductor within the perimeter termination trench.

The semiconductor device may have an embodiment that includes a separation insulator positioned between each gate conductor and each shield conductor.

Those skilled in the art will also appreciate that an example of an embodiment of a method of forming a semiconductor device may comprise:
providing a semiconductor substrate, such as for example substrate 20;
forming a first doped region such as for example region 21 or 34, of a first conductivity type on a surface of the semiconductor substrate;
forming one or more first openings, such as for example openings 22, having opposing sidewalls extending from the surface into at least the first doped region, wherein the one or more first openings have a first width;
forming a second opening, such as for example opening 17, surrounding the one or more first openings, including forming the second opening to have a first sidewall and an opposing second sidewall that extend from the surface into at least the first doped region;
forming a first insulator, such as for example one of insulators 25 or 28 or 50, having a first thickness along sidewalls of the one or more first openings, and along the first sidewall and the opposing second sidewall of the second opening;
forming a second insulator on the first insulator that is on the first and second sidewalls of the second opening;

removing a portion of the first insulator and the second insulator, such as for example insulator 54, that are along a portion of the first sidewall, such as for example an inner sidewall, of the second opening wherein the first sidewall is closer to the one or more first openings than the opposing second sidewall of the second opening, and removing a portion of the first insulator from along at least a portion of both sidewalls of the one or more first openings;

forming a third insulator, such as for example insulator 51, along the first sidewall of the second opening and along both sidewalls of the one or more first openings; and forming a gate conductor, such as for example conductor 29, within the one or more first openings and adjacent the third insulator, and forming the gate conductor, such as for example conductor 56, within the second opening and adjacent the second insulator and the third insulator.

The method may have an embodiment that may also include forming a gate interconnect conductor, such as for example conductor 49, overlying a portion of the second opening.

An embodiment may also include forming one or more projections, such as for example the projections 19, of the second opening that extend in a direction away from the one or more first openings, forming the first insulator along sidewalls of the one or more projections, and forming the gate conductor within the one or more projections and adjacent the second insulator.

Another embodiment may also include forming a gate interconnect conductor, such as for example conductor 49, overlying a portion of the one or more projections and extending into the one or more projections to make an electrical contact to the gate conductor.

The method may also have an embodiment that may include forming the second opening to have a width that is greater than the width of the one or more first opening.

Those skilled in the art will also appreciate that an example of an embodiment of a method of forming a semiconductor device may also comprise:

providing a semiconductor substrate, such as for example substrate 20, having a doped region, such as for example doped regions 21 and/or 34, formed therein;

forming a plurality of active trenches, such as for example trenches 23, in an active region, such as for example region 13, including forming each active trench to extend a distance into at least the doped region;

forming a first insulator, such as for example insulator 30, along sidewalls of each active trench wherein the first insulator has a first thickness; and forming a perimeter termination trench, such as for example trench 18, surrounding the active region including forming a second insulator, such as for example insulator 51, along a sidewall that is adjacent the active region wherein the second insulator has a second thickness, and forming a third insulator, such as for example insulator 50, along an opposite sidewall of the perimeter termination trench with the third insulator having a third thickness that is greater than the second thickness.

An embodiment of the method may also include forming the second thickness, such as for example thickness 51, to be substantially the first thickness.

Another embodiment may include forming a width of the perimeter termination trench to be greater than the width of an active trench of the plurality of active trenches.

An embodiment may also include forming a plurality of gate contact trenches, such as for example trenches 19, that are positioned along a side of the active region and extend in a direction away from the plurality of active trenches, including forming the plurality of gate contact trenches to have sidewalls that extend into the doped region, and forming the third insulator along the sidewalls of the plurality of gate contact trenches.

An embodiment may also include forming a gate interconnect conductor, such as for example conductor 49, to overlie a portion of the perimeter termination trench, such as for example trench 18.

In view of all of the above, it is evident that a novel device and method is disclosed. Included, among other features, is forming a device that has a perimeter termination trench surrounding the active area. The perimeter termination trench has insulator 50, or alternately insulators 50 and 54, on an outside sidewall that is thicker than the insulator 30 used for the gate insulators in the active region. The perimeter termination trench also has a width that is wider than a width of the active trenches in the active region. The thicker insulator on the outside sidewall and the wider width assist in providing an improved breakdown voltage for device 10. A portion of the perimeter termination trench also extends to form a gate contact trench that facilitates forming an electrical contact to the gate conductor in the active region. The thick insulator on the sidewalls of trenches 19 facilitate device 10 and/or 100 withstanding breakdown voltages and therefore allows fewer trenches 19 to be used, with wider spacings between trenches 19. This reduces the capacitance between the gate and drain due to the gate contact area of the device, resulting in improved switching performance of the device.

While the subject matter of the descriptions is described with specific preferred embodiments and example embodiments, the foregoing drawings and descriptions thereof depict only typical and non-limiting examples of embodiments of the subject matter and are not therefore to be considered to be limiting of its scope, it is evident that many alternatives and variations will be apparent to those skilled in the art. As will be appreciated by those skilled in the art, a variety of methods may be utilized to form insulators 50 and 51 within trench 18, as long as the method provides insulator 50 on the outside sidewall and insulator 51 on the inside sidewall.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

The invention claimed is:

1. A semiconductor device having a transistor, the semiconductor device comprising:

the transistor having an active region that has a plurality of active trenches, each active trench of the plurality of active trenches extending continuously through the active region;

a gate conductor within each active trench of the plurality of active trenches;

a source region positioned adjacent to a first active trench of the plurality of active trenches, the source region spaced laterally apart from the first active trench;

a first insulator of a first thickness along sidewalls of each active trench wherein the gate conductor is positioned between the first insulator that is on opposite sidewalls of each active trench wherein a portion of the first insulator within the first active trench extends to overlie a portion of the source region;

a perimeter termination trench surrounding the active region, the perimeter termination trench having a second insulator of a second thickness along at least a portion of an inner sidewall that is adjacent to the active region and having a third insulator of a third thickness along an outer sidewall that is opposite to the inner sidewall, wherein the third thickness is greater than the second thickness;

the gate conductor extending in a first lateral direction continuously through each active trench and alongside the first insulator, the gate conductor having two opposite ends wherein the two opposite ends of the gate conductor extend from each active trench into the perimeter termination trench to form a gate connection conductor positioned between and contacting the second insulator and the third insulator; and one or more gate contact trenches, of the perimeter termination trench, wherein each of the one or more gate contact trenches has opposing sides that project and extend in a direction that is away from an end of one or more of the plurality of active trenches, the third insulator positioned along each sidewall of the opposing sides of the one or more gate contact trenches, the gate conductor extending within the one or more gate contact trenches and positioned between the third insulator along opposing sidewalls of the one or more gate contact trenches.

2. The semiconductor device of claim 1 wherein the second thickness is substantially the first thickness.

3. The semiconductor device of claim 1 further including a gate interconnect conductor overlying at least a portion of the one or more gate contact trenches.

4. The semiconductor device of claim 1 further including a second source region positioned between the first active trench and an adjacent active trench of the plurality of active trenches.

5. The semiconductor device of claim 1 further including a gate interconnect conductor overlying the one or more gate contact trenches and extending into the one or more gate contact trenches to electrically connect to the gate conductor therein.

6. The semiconductor device of claim 5 wherein the gate interconnect conductor does not overlie the gate conductor within an active trench of the plurality of active trenches.

7. The semiconductor device of claim 1 wherein the gate conductor within the one or more gate contact trenches has a width that is greater than a width of the gate conductor within an active trench of the plurality of active trenches.

8. The semiconductor device of claim 1 further including the one or more gate contact trenches having a connecting portion that connects together the opposing sides, the third insulator along each sidewall of the connecting portion of the one or more gate contact trenches.

9. The semiconductor device of claim 1 further including a shield conductor within each active trench and underlying the gate conductor therein, and also underlying the gate conductor within the perimeter termination trench.

10. The semiconductor device of claim 9 further including a separation insulator positioned between the gate conductor and the shield conductor.

11. The semiconductor device of claim 1 further including a source conductor overlying a central portion of the active region and a central portion of the plurality of active tranches, the gate conductor extending continuously underlying the source conductor that is overlying the central portion.

12. The semiconductor device of claim 1 wherein the gate conductor extends continuously through a central portion of the active region.

13. The semiconductor device of claim 1 wherein the portion of the inner sidewall of the perimeter termination trench extends in a lateral direction substantially perpendicular to the gate conductor.

14. The semiconductor device of claim 1 wherein the two opposite ends of the gate conductor includes a first end that extends from each active trench into the perimeter termination trench and to a first side of the perimeter termination trench, and includes a second end that is opposite to the first end wherein the second end extends from each active trench into the perimeter termination trench toward a second side of the perimeter termination trench and wherein the gate conductor extends continuously through each active trench from the first end to the second end.

15. The semiconductor device of claim 1 wherein the first insulator is adjacent to the gate conductor and wherein the portion of the first insulator extends past the gate conductor and extends to overlie the portion of the source region.

16. A semiconductor device having a transistor, the semiconductor device comprising:

the transistor having an active region that has a plurality of active trenches;

a gate conductor within each active trench of the plurality of active trenches wherein the gate conductor extends continuously through the active trench;

a first insulator of a first thickness along sidewalls of each active trench wherein the gate conductor is positioned between the first insulator that is on opposite sidewalls of each trench;

a perimeter termination trench surrounding the active region, the perimeter termination trench having a second insulator of a second thickness along at least a portion of an inner sidewall that is adjacent to the active region and having a third insulator of a third thickness along an outer sidewall that is opposite to the inner sidewall, wherein the third thickness is greater than the second thickness;

the gate conductor having a first portion extending from a first end of each active trench into the perimeter termination trench toward the third insulator, the gate conductor having a second portion extending from a second end of each active trench into the perimeter termination trench to form a gate connection conductor positioned between and contacting the second insulator and the third insulator, the gate connection conductor having a width that is greater than a width of the gate conductor within an active trench; and one or more gate contact trenches, of the perimeter termination trench, wherein each of the one or more gate contact trenches has opposing sides that project and extend in a direction that is away from an end of one or more of the plurality of active trenches, the third insulator along each sidewall of the one or more gate contact trenches and the gate conductor extending within the one or more gate contact trenches and positioned between the third insulator along opposing sidewalls of at least one gate contact trench of the one or more gate contact trenches wherein at least one of the one or more gate contact trenches does not have a connection to an overlying gate interconnect conductor.

17. A semiconductor device having a transistor, the semiconductor device comprising:
the transistor having a first active region that has a plurality of first active trenches, the transistor having a second active region that is spaced apart from the first active region wherein the second active region has a plurality of second active trenches;
the first active region having a first end and having a second end, the second end of the first active region opposite to the first end of the first active region;
the second active region having a first end that is facing toward the first end of the first active region, the second active region having a second end that is opposite to the first end of the second active region;
first gate conductor within the first active trenches wherein the first gate conductor extends through the first active trenches;
a first insulator of a first thickness along sidewalls of the first active trenches wherein the first gate conductor is positioned between the first insulator that is on opposite sidewalls of the first active trenches;
a second insulator of a second thickness along sidewalls of the second active trenches of the plurality of second active trenches;
a second gate conductor within the second active trenches wherein the second gate conductor extends through the second active trenches;
a perimeter termination trench surrounding the first active region and surrounding the second active region, the perimeter termination trench having a third insulator of a third thickness along at least a portion of an inner sidewall that is adjacent to the first active region and the second active region, the perimeter termination trench having a fourth insulator of a fourth thickness along an outer sidewall that is opposite to the inner sidewall, wherein the fourth thickness is greater than the first thickness, greater than the second thickness, and greater than the third thickness;
one or more gate contact trenches of the perimeter termination trench wherein the one or more gate contact trenches are disposed only in a region between the first active region and the second active region, the one or more gate contact trenches having opposing sides that project and extend in a direction from the first end of the first active region to the first end of the second active region wherein the fourth insulator is along the opposing sidewalls; and
a gate interconnect conductor overlying the one or more gate contact trenches.

18. The semiconductor device of claim 17 wherein a first portion of the first gate conductor extends from the first active trenches into the perimeter termination trench and wherein a first portion of the second gate conductor extends from the second active trenches into the perimeter termination trench toward the fourth insulator.

19. The semiconductor device of claim 17, wherein a first portion of the outer sidewall of the perimeter termination trench is spaced away from the second side of the first active region and extends substantially continuously along the second side of the first active region.

* * * * *